(12) United States Patent
Li et al.

(10) Patent No.: US 7,767,099 B2
(45) Date of Patent: *Aug. 3, 2010

(54) SUB-LITHOGRAPHIC INTERCONNECT PATTERNING USING SELF-ASSEMBLING POLYMERS

(75) Inventors: Wai-Kin Li, Beacon, NY (US); Haining S. Yang, Wappingers Falls, NY (US)

(73) Assignee: International Business Machines Corporaiton, Armonk, NY (US)

(*) Notice: Subject to any disclaimer, the term of this patent is extended or adjusted under 35 U.S.C. 154(b) by 434 days.

This patent is subject to a terminal disclaimer.

(21) Appl. No.: 11/627,488

(22) Filed: Jan. 26, 2007

(65) Prior Publication Data

US 2008/0182402 A1    Jul. 31, 2008

(51) Int. Cl.
B44C 1/22 (2006.01)
H01L 21/302 (2006.01)
B82B 3/00 (2006.01)

(52) U.S. Cl. .............. 216/2; 216/17; 216/39; 216/41; 216/49; 216/83; 216/55; 216/67; 216/99; 427/98.5; 427/256; 438/700; 438/947; 977/888; 977/895; 977/900

(58) Field of Classification Search .............. 216/49
See application file for complete search history.

(56) References Cited

U.S. PATENT DOCUMENTS

| | | | |
|---|---|---|---|
| 5,744,835 A | 4/1998 | Inoue | |
| 5,948,470 A * | 9/1999 | Harrison et al. | 427/198 |
| 6,518,194 B2 | 2/2003 | Winningham et al. | |
| 6,534,399 B1 | 3/2003 | Krivokapic | |
| 6,630,404 B1 | 10/2003 | Babcock | |
| 6,703,304 B1 | 3/2004 | Krivokapic | |
| 6,773,616 B1 | 8/2004 | Chen et al. | |
| 7,071,023 B2 | 7/2006 | Bertin et al. | |
| 7,347,953 B2 * | 3/2008 | Black et al. | 216/83 |
| 7,384,852 B2 * | 6/2008 | Yang et al. | 438/299 |
| 7,560,141 B1 * | 7/2009 | Kim et al. | 427/372.2 |
| 7,579,278 B2 * | 8/2009 | Sandhu | 438/689 |
| 2005/0167838 A1 * | 8/2005 | Edelstein et al. | 257/758 |

(Continued)

FOREIGN PATENT DOCUMENTS

JP      2005 033184      3/2005

(Continued)

OTHER PUBLICATIONS

Yamaguchi, T. et al "Resist-Pattern Guided Self-assembly of Symmetric Diblock Copolymer" J Photopolymer Sci Tech, 19 (3) 385-388, Aug. 2006.*

(Continued)

*Primary Examiner*—Anita K Alanko
(74) *Attorney, Agent, or Firm*—Wenjie Li

(57) ABSTRACT

The present invention is directed to the formation of sublithographic features in a semiconductor structure using self-assembling polymers. The self-assembling polymers are formed in openings in a hard mask, annealed and then etched, followed by etching of the underlying dielectric material. At least one sublithographic feature is formed according to this method. Also disclosed is an intermediate semiconductor structure in which at least one interconnect wiring feature has a dimension that is defined by a self-assembled block copolymer.

24 Claims, 9 Drawing Sheets

U.S. PATENT DOCUMENTS

| | | | |
|---|---|---|---|
| 2005/0263025 A1 | 12/2005 | Blees | |
| 2006/0056474 A1* | 3/2006 | Fujimoto et al. | 372/43.01 |
| 2007/0224823 A1* | 9/2007 | Sandhu | 438/694 |
| 2007/0281220 A1* | 12/2007 | Sandhu et al. | 430/5 |
| 2007/0289943 A1* | 12/2007 | Lu et al. | 216/41 |
| 2008/0041818 A1* | 2/2008 | Kihara et al. | 216/41 |
| 2008/0176767 A1* | 7/2008 | Millward | 506/20 |
| 2008/0193658 A1* | 8/2008 | Millward | 427/401 |
| 2008/0217292 A1* | 9/2008 | Millward et al. | 216/46 |
| 2008/0233323 A1* | 9/2008 | Cheng et al. | 428/36.91 |
| 2008/0299774 A1* | 12/2008 | Sandhu | 438/696 |
| 2009/0200646 A1* | 8/2009 | Millward et al. | 257/632 |

FOREIGN PATENT DOCUMENTS

| | | |
|---|---|---|
| WO | WO 2006112887 | 10/2006 |

OTHER PUBLICATIONS

Cheng, J. Y. et al, Applied Physics Letters, "Fabrication of nanostructures with long-range order using block copolymer lithography" 81 (19) 3657-3659, Nov. 4, 2002.*

Cheng, Joy T. et al, Nano Letters, "Self-Assembled One-Dimensional Nanostructure Arrays" 6 (9) 2099-2103, Aug. 16, 2006.*

Segalman, Rachel A. et al, Advanced Materials, "Graphoepitaxy of Spherical Domain Block Copolymer Films" 13 (15) 1152-1155, Aug. 3, 2001.*

IBM Technical Disclosure Bulletin, "Self-Assembled Monolayers as High-Resolution Resists", vol. 39, No. 04, Apr. 1996, pp. 111-112.

IBM Techical Disclosure Bulletin, "Fabrication of Gold Nonostructures by Lithography With Self-Assembled Monolayers", Biebuyck, et al. vol. 39. No. 12, Dec. 1996, pp. 235-238.

"Self-Assembling Resists for Nanolithography", Nealey, et al., 2005, IEEE, 4 Pages.

* cited by examiner

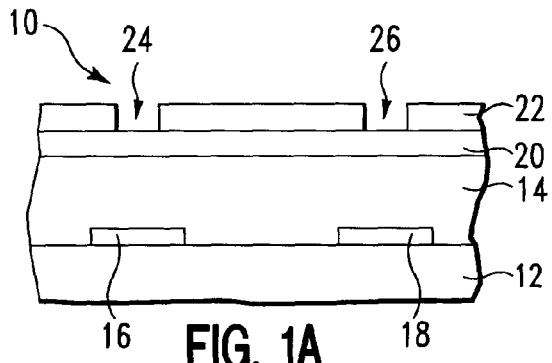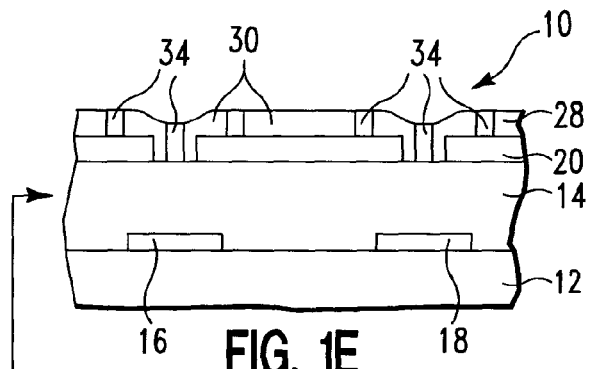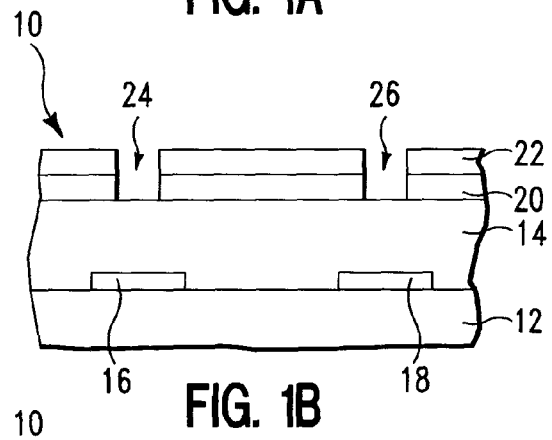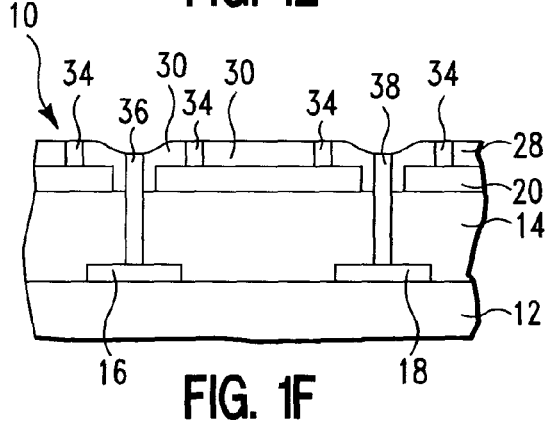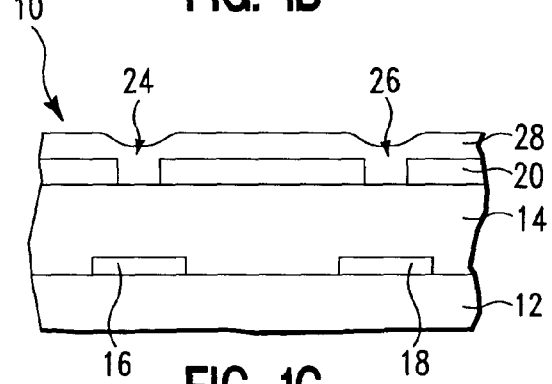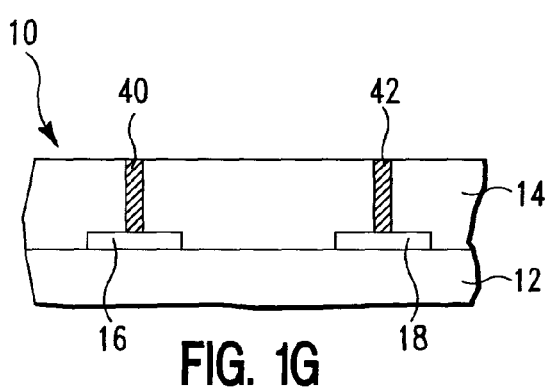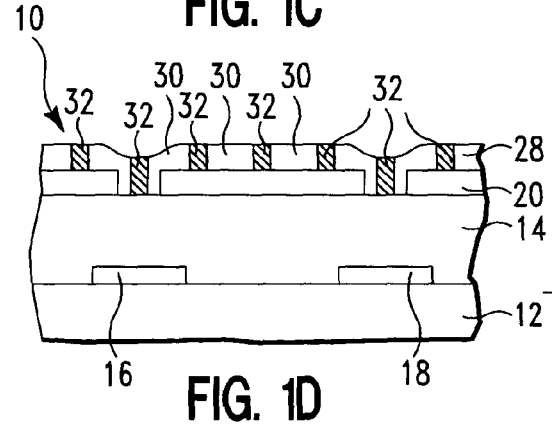

SUB-LITHOGRAPHIC INTERCONNECT PATTERNING USING SELF-ASSEMBLING POLYMERS

BACKGROUND OF THE INVENTION

The present invention relates generally to the fabrication of integrated circuits and, more particularly, relates to the fabrication of integrated circuits by a patterning process which uses self-assembling polymers.

The semiconductor industry has a need to manufacture integrated circuits (ICs) with higher and higher densities of devices on a smaller chip area to achieve greater functionality and to reduce manufacturing costs. This desire for large-scale integration has led to a continued shrinking of the circuit dimensions and features of the devices.

The ability to reduce the sizes of structures such as gates in field effect transistors (FETs), is driven by lithographic technology which is, in turn, dependent upon the wavelength of light used to expose the photoresist. In current commercial fabrication processes, optical devices expose the photoresist using light having a wavelength of 193 nm (nanometers). Research and development laboratories are experimenting with the EUV (13 nm) wavelength to reduce the size of structures. Further, advanced lithographic technologies are being developed that utilize immersion techniques to improve resolution.

One challenge facing lithographic technology is fabricating features having a critical dimension (CD) below 70 nm. All steps of the photolithographic techniques currently employed must be improved to achieve the further reduction in feature size.

In a conventional technique, light is exposed through a binary mask to a photoresist layer on a layer of material. The photoresist layer may be either a positive or a negative photoresist and can be a silicon-containing, dry-developed resist. In the case of a positive photoresist, the light causes a photochemical reaction in the photoresist. The photoresist is removable with a developer solution at the portions of the photoresist that are exposed through the mask. The photoresist is developed to clear away these portions, whereby a photoresist feature remains on the layer of material. An integrated circuit feature, such as a gate, via, or interconnect, is then etched into the layer of material, and the remaining photoresist is removed.

The linewidth of the integrated circuit feature is limited using the conventional process. For example, aberrations, focus, and proximity effects in the use of light limit the ability to fabricate features having reduced linewidth. Using a 248 nm wavelength light source, the minimum printed feature linewidth is between 300 and 150 nm, using conventional techniques. The most advanced lithography tools can now resolve to 100 nm feature size which be improved to 70 to 80 nm with immersion lithography. With IC design expected to require sub-50 nm interconnects, it is apparent that conventional lithography cannot meet this design requirement.

Accordingly there is a need for reducing the IC interconnect opening diameter to below the resolutions of the conventional lithographic tools, to improve circuit layout density.

It has been known that certain materials are capable of organizing into ordered patterns under certain desired conditions, which is typically referred to as the self-assembly of materials.

Self-assembling polymers are capable of self-organizing into nanometer-scale patterns, enabling future advances in semiconductor technology as shown for example in Nealey et al., "Self-assembling resists for nanolithography" Electron Devices Meeting. 2005. IEDM Technical Digest. IEEE International 5-7 Dec. 2005 Page(s):4 pp the disclosure in which is incorporated by reference herein, as described in this reference, each self-assembling polymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units. Along the same lines, Edelstein et al. U.S. Patent Application Publication 2005/0167838, the disclosure of which is incorporated by reference herein, discloses the use of a self-assembled polymer pattern to form sub-lithographic features in an oxide.

Some, such as Babcock U.S. Pat. No. 6,630,404 and Krivokapic U.S. Pat. No. 6,534,399, the disclosures of which have been incorporated by reference herein, have proposed self-assembled monolayers to reduce feature size of a lithographically defined feature. The result is not a self-assembled pattern.

Others, such as Chen et al. U.S. Pat. No. 6,773,616, the disclosure of which has been incorporated by reference herein, have proposed self-assembled polymers to pattern a hard mask. There is no pattern registration with an underlying layer.

IBM Technical Disclosure Bulletin, "Self-Assembled monolayers as High-Resolution Resists, vol. 39, No. 04, p. 111, and IBM Technical Disclosure Bulletin, "Fabrication of Gold Nanostructures by Lithography with Self-Assembled Monolayers", vol. 39, No. 12, p. 235, the disclosures of which are incorporated by reference herein, disclose forming self-assembled monolayers and then "writing" on them with a Scanning tunneling Microscope or ultraviolet light to form patterns.

Aizenberg et al. J1P2005033184, the disclosure of which is incorporated by reference herein, begins with a lithographically formed feature and then uses a self-assembled monomolecular film to form multiple sublithographic features within the lithographically-formed feature.

IC technology, however, requires precise placement or registration of individual structural units for formation of metal lines and vias in the wiring levels. Therefore, an ordered array of repeating structural units formed by self-assembling polymers could not be used in IC devices, because of lack of alignment or registration of the position of individual structure units.

Accordingly, it is an object of the present invention to use self-assembling polymers to form sublithographic features which are registered with a previously-defined lithographic pattern.

It is another object of the present invention to use self-assembling polymers which assemble upon annealing to form sublithographic features which are registered with a previously-defined lithographic pattern.

It is yet another object of the present invention to use block copolymers as the self-assembling polymers in the present invention.

These and other purposes of the present invention will become apparent after referring to the following description of the invention considered in conjunction with the accompanying figures.

BRIEF SUMMARY OF THE INVENTION

The purposes of the invention have been achieved by providing according to a first embodiment of the present invention, a method of forming patterned features in a semiconductor device structure comprising the steps of:

(a) forming a patterned mask layer over a surface of the semiconductor device structure, wherein said patterned mask layer comprises at least one mask opening;

(b) applying a layer of a block copolymer over the patterned mask layer and in the at least one mask opening, said block copolymer comprising first and second polymeric block components that are immiscible with each other, (c) annealing the block copolymer layer to form a polymer block pattern inside said at least one mask opening, and wherein the polymer block pattern comprises the second polymeric block component embedded in a polymeric matrix that comprises the first polymeric block component;

(d) selectively removing the second polymeric block component from the first polymeric block component to form an opening in the polymeric matrix inside said at least one mask opening; and (e) patterning the semiconductor device structure using the opening of the copolymer and the at least one mask opening.

According to another embodiment of the present invention, there is provided a method of forming patterned features in a semiconductor device structure, comprising the steps of:

(a) forming a patterned mask layer over a surface of the semiconductor device structure wherein said patterned layer comprises first and second mask openings;

(b) applying a first layer of a block copolymer over the pattered mask layer and in at least one first mask opening, said block copolymer comprising first and second polymeric block components that are immiscible with each other;

(c) annealing the first block copolymer layer to form a first polymer block pattern inside said at least one first mask opening, and wherein said first polymer block pattern comprises the second polymeric block component embedded in a polymeric matrix that comprises the first polymeric block component;

(d) applying a second layer of a block copolymer over the patterned mask layer and in at least one second mask opening wherein said block copolymer comprises at least first and second polymeric block components;

(e) annealing the second block copolymer layer to form a second polymer block pattern inside said at least one second mask opening, and wherein each polymer block pattern comprises the second polymeric block component and embedded in a polymeric matrix that comprises the first polymeric block component;

(f) selectively removing the second polymeric block component from the first polymeric block component in said at least one first and second mask openings so as to form an opening in the polymeric matrix inside said at least one first mask opening and an opening in the polymeric matrix inside said at least one second mask opening; and (g) patterning the semiconductor device structure using the openings of the copolymer and the at least one first and second mask openings.

According to another embodiment of the present invention, there is provided an intermediate semiconductor structure comprising:

a semiconductor device structure having a plurality of interconnect wirings wherein at least one of the interconnect wirings has a dimension that is defined by a self-assembled block copolymer, and at least one of the interconnect wirings has a dimension that is defined by a lithographically patterned mask.

According to a further embodiment of the present invention there is provided an intermediate semiconductor structure comprising:

a semiconductor device structure having a plurality of interconnect wirings wherein at least one of the interconnect wirings has a dimension that is defined by a self-assembled block copolymer.

BRIEF DESCRIPTION OF THE DRAWINGS

The features of the invention believed to be novel and the elements characteristic of the invention are set forth with particularity in the appended claims. The Figures are for illustration purposes only, and are not drawn to scale. The invention itself, however, both as to organization and method of operation, may best be understood by reference to the detailed description which follows taken in conjunction with the accompanying drawings in which:

FIGS. 1A to 1G are figures illustrating the process for forming a first embodiment according to the present invention.

DETAILED DESCRIPTION OF THE INVENTION

Figure 2A:
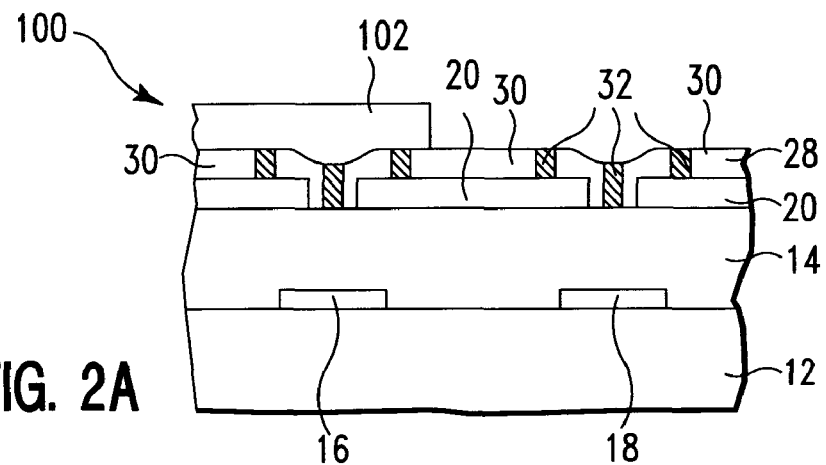
FIGS. 2A to 2D are figures illustrating the process for forming a second embodiment according to the present invention.

Referring to the Figures in more detail, and particularly referring to FIGS. 1A through 1G, there is illustrated a process for forming a first preferred embodiment of the present invention. Referring now to FIG. 1A, there is illustrated a semiconductor structure 10 comprising a semiconductor base 12 and wiring features 16, 18. Wiring features 16, 18 can be formed on the semiconductor base 12 during front end of the line processing or can be formed during formation of the wiring levels during back end of the line processing. It is not important to the present invention whether wiring features are as a result of front end of the line processing or back end of the line processing. Further, wiring features 16, 18 are formed in interlayer dielectric (ILD) 14.

The present invention is useful for forming sublithographic features through the ILD 14 and making contact with wiring features 16, 18. The sublithographic features maybe, for example, wiring lines or vias.

On top of ILD 14 is formed a conventional hard mask 20. Conventional photoresist 22 is applied on hard mask 20 and then conventionally patterned by a process of exposing and developing the photoresist to form openings 24, 26 in the photoresist 22. Thereafter, hard mask 20 is etched, preferably dry etched such as by reactive ion etching (RIE), to continue openings 24,26 through hard mask 20 as shown in FIG. 1B.

Photoresist 22 is then stripped and self-assembling polymer 28 is blanket applied over hard mask 20 and in openings 24,26 as shown in FIG. 1C. Self-assembling polymer 28 maybe any self-assembling polymeric material that is capable of forming periodic patterns on a sublithographic spacing. Some examples of these self-assembling polymeric materials are polystyrene-block-polymethacrylate (PS-b-PMMA), polystyrene-block-polyisoprene (PS-b-PI) polystyrene-block-polybutadiene (PS-b-PBD), polystyrene-block-polyvinylpyridine (PS-b-P VP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethylenoxide-block-polymethylmethacrylate (PEO-b-PMMA), polyethyleneoxide-block-polyethylethylene (PEO-b-PEE), polybutadiene-block-polyvinylpyrdine (PBD-b-PVP), and polyisoprene-block-polymethylmethacrylate (PI-b-PMMA).

A particularly preferred self-assembling polymer is a block copolymer comprising polystyrene and poly (methyl methactylate). The polystyrene and poly (methyl methacrylate), respectively, are preferrably present at a weight ratio of about 80:20 to about 60:40. At this point in the process, the self-assembling polymer has not assembled into its periodic pattern.

The self-assembling polymer may be all organic such as the above mixture of polystyrene and poly (methyl methacrylate) or may be a mixture of organic and inorganic materials such as polystyrene and ferrocenyldimethylsilane.

Figure 4:
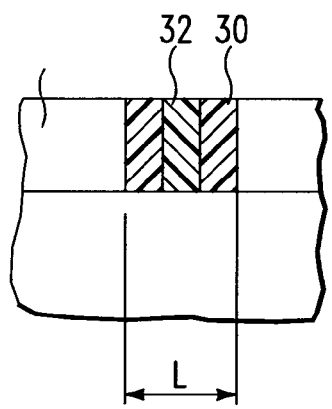
FIG. 4 is a representation of a critical dimension L for forming a self-assembling polymer structure according to the present invention.

Referring not to FIG. 1D, self-assembling polymer 28 is annealed at about 100 to 350° C. Upon annealing self-assembling polymer 28 forms a periodic pattern of a first component polymeric matrix 30 containing second components 32, such as PS and PMMA. As can be seen from FIG. 1D, the dimensions of openings 24, 26 have been chosen such that only one second component 32 forms in each of the openings 24, 26. Referring now to FIG. 4, based on the block copolymer of polystyrene and poly (methyl methacrylate), the spacing L is chosen to be between 60 and 100 nanometers (nm) so that only one second component 32 forms in each of the openings 24, 26. This spacing is based on the inherent pattern formation of self-assembling polymers wherein the spacing between adjacent second components is about 20 to 40 nm. The preferred spacing L will vary depending on the particular self-assembling polymer used. The periodic pattern of first component 30 and second component 32 may continue on top of hard mask 20 but this part of the periodic pattern is not essential to the present invention. The pattern in this area will not be transferred into semiconductor structure because it will be blocked by the underlying hardmask during the pattern transfer RIE process.

Referring now to FIG. 1E, second compartment 32 has been selectively removed to form openings 34. Selective removal may be by wet etching or dry etching. A preferred method of selectively removing second component 32 is by wet etching with acetic acid solution. It is also possible to leave the second polymer when the RIE selectivity between first and second polymer is sufficient. Openings 34 are smaller than openings 24, 26. If openings 24, 26 are at or near the limit of advanced lithography, then openings 34 are smaller than those that can be obtained by advanced lithographs and thus are sublithographic in size.

The process continues by etching ILD 14 through openings 34 to form openings 36, 38 in the ILD 14. Where self-assembling polymer 28 overlies hard mask 20 there will be no etching of the ILD 14. It is only where openings 34 are present in the openings 24, 26 in the hard mask that etching of the ILD 14 can occur. Etching of the ILD 14 may be by any conventional process such as RIE. Etching of the ILD 14 continues until wiring features 16, 18 are reached as illustrated in FIG. 1F.

Thereafter, self-assembling polymer 28 is removed by wet or dry etching such as oxygen plasma etching and hard mask 20 is removed by conventional means. Openings 36, 38 in ILD 14 are then conventionally filled with metallic material, such as aluminum, copper or tungsten, depending on the wiring level and application to form wiring features 40, 42. By way of illustration and not limitation, wiring feature 40 may be a wiring line while wiring feature 42 may be a via.

Referring now to FIGS. 2A through 2D, there is shown a second preferred embodiment according to the present invention. FIG. 2A is similar to FIG. 1D in that a semiconductor base 12 has wiring features 16, 18 and ILD 14 over which a hard mask 20 has been patterned as described previously to form semiconductor structure 100. Thereafter, self-assembling polymer 28 is applied and annealed to form second components 32 within first component polymeric matrix 30 as also described previously. In this embodiment of the present invention, it is desirable to remove the self-assembling polymer 28 from some of the openings in the hard mask 20, one of which is opening 26. Accordingly, mask 102 is formed by applying a spin-on material such as a photo resist layer or a spin-on glass layer (SOG). It is preferred to use SOG to achieve sufficient etch selectivity. The SOG layer is patterned by reactive ion etching with fluorocarbon gas using photoresist as a mask. The SOG layer provides a shield for that part of self-assembling polymer layer 28 which is to be retained.

Figure 2B:
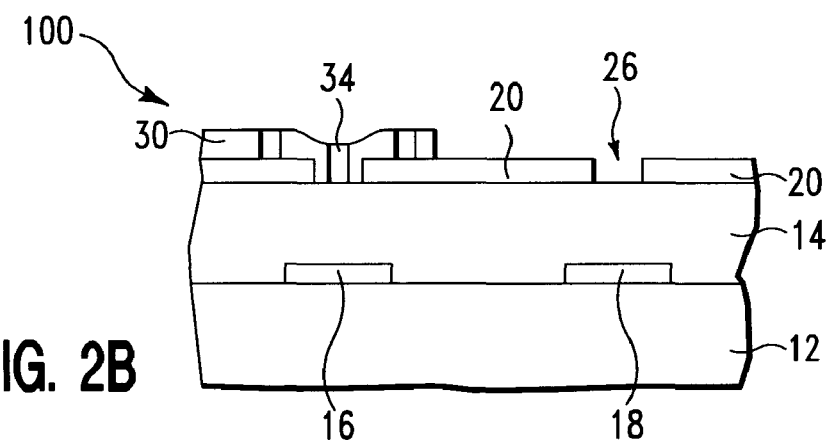

The exposed part of self-assembling polymer layer 28 is etched as described previously to remove it from hard mask 20. Thereafter, mask 102 is removed using RIE process described previously until the top of the self-assembling material appears. Then, the second component 32 is etched from self-assembling polymer layer 28 to form openings 34. The resulting structure thus far is shown in FIG. 2B.

Figure 2C:
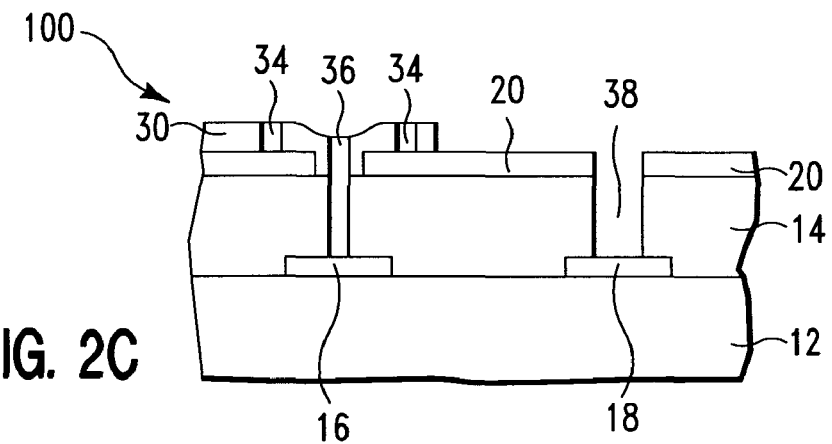
Figure 2D:
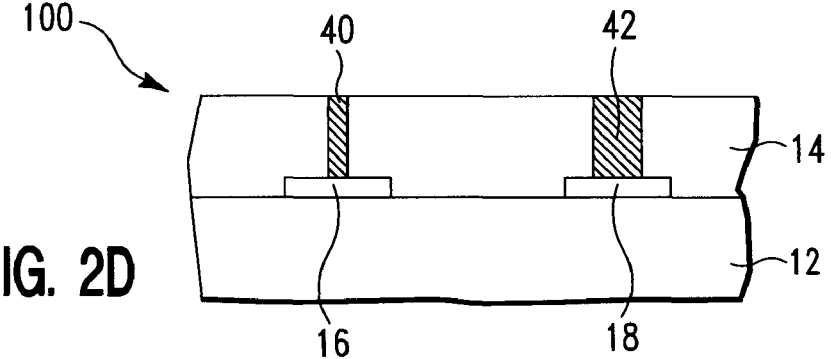

Referring now to FIG. 2C, ILD 14 is etched through openings 34 and 26 to form openings 36, 38. Opening 38 is larger in dimension than opening 36. As can be appreciated, opening 36 in ILD 14 is sublithographic in dimension while opening 38 is lithographically defined.

Finally, the remaining self-assembling polymer 28 is removed using oxygen containing plasma RIE process from hard mask 20 and hard mask 20 is removed from ILD 14. Openings 36, 38 are filled with a suitable conducting material to form wiring features 40, 42 which as can be appreciated can be a via or a wiring line or any combination thereof. Wiring features 40, 42 make contact with wiring features 16, 18.

Figure 3A:
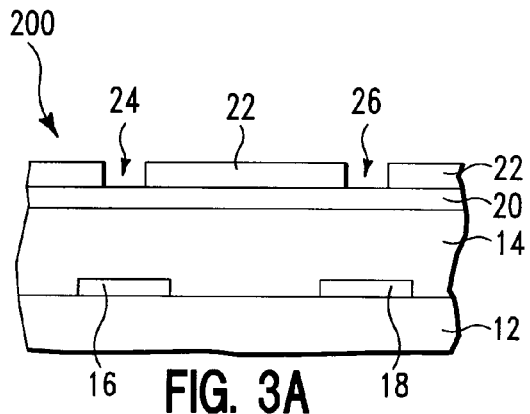
FIGS. 3A to 3J are figures illustrating the process for forming a third embodiment according to the present invention.

Referring now to FIGS. 3A through 3J, there is shown a third embodiment according to the present invention. In this embodiment, it is desired to use at least two different self-assembling polymers to form the sublithographic features such that sublithographic dimension via and sublithographic dimension line patterns may be formed on the surface of the device. Referring now to FIG. 3A, semiconductor structure 200 is essentially identical to semiconductor structure 10 shown in FIG. 1A. Hard mask 20 has been patterned in FIG. 3A similarly to that shown for hard mask 20 in FIG. 1A.

Figure 3B:
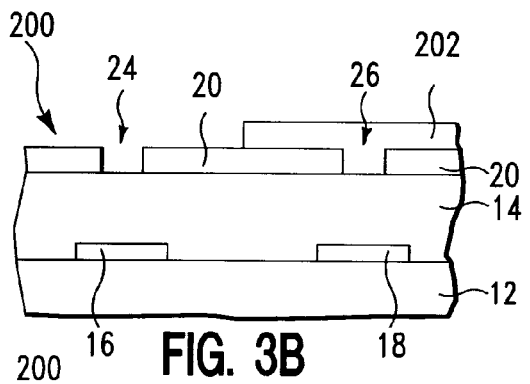

As shown in FIG. 3B, mask 202 using spin-on material such as SOG has been formed over hard mask 20 to block opening 26.

Figure 3C:
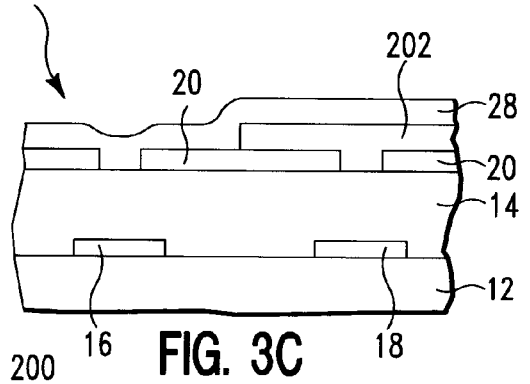

In FIG. 3C, self-assembling polymer layer 28 has been blanket applied over hard mask 20, mask 202 and in opening 24.

Figure 3D:
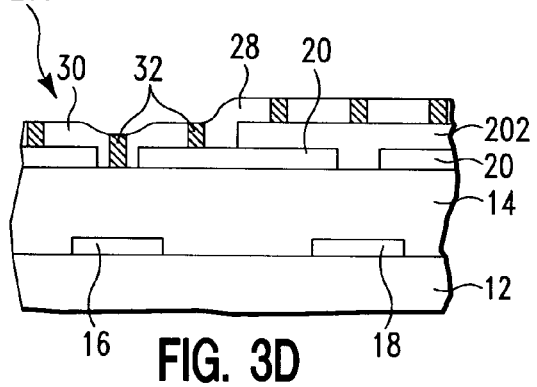

Thereafter, self-assembling polymer layer 28 has been annealed as described above so that second components 32 form within polymeric matrix 30 as illustrated in FIG. 3D.

Figure 3E:
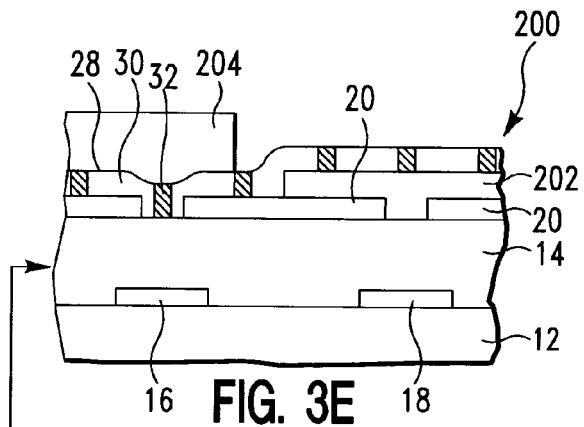
Figure 3F:
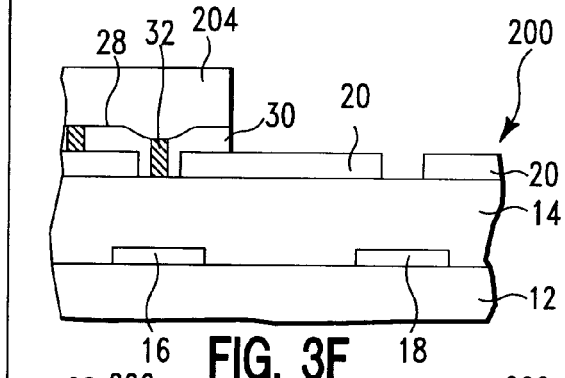

It is next desirable to mask off self-assembling polymeric layer 28 over opening 24 to protect it during further processing. Mask 204 is applied as shown in FIG. 3E using the method described in previous embodiment and then the self-assembling polymer layer 28 is etched to remove it where it is not protected by mask 204. Mask 202 is then etched using fluorocarbon gas plasma RIE process to remove it from hard mask 20 and opening 26 as illustrated in FIG. 3F.

Figure 3G:
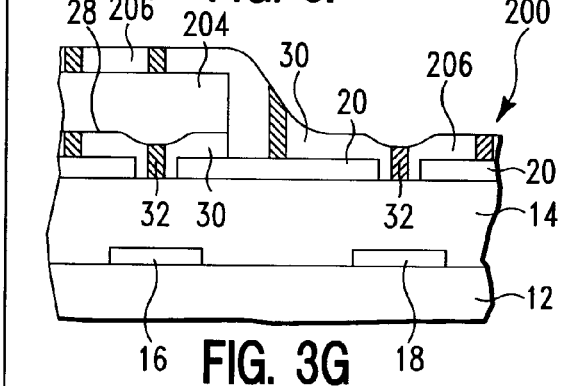

Referring now to FIG. 3G, self-assembling polymer 206 is blanket applied over mask 204, hard mask 20 and in opening 26. Self-assembling polymer 206 may be a totally different self-assembling polymer than self-assembling polymer 28 or may just have different ratios of the components of the polymer. For example, self-assembling polymer 28 may be of 70:30 mixing ratio to form a line pattern while self-assembling polymer 206 may be of 50:50 mixing ratio to achieve a via pattern. Self-assembling polymer 206 is then annealed. The device surface is then planarized using chemical-mechanical polishing (CMP) to remove SOG and self-assembly polymer from top surface of the hardmask layer. Thus, self-assembly patterns remain inside the hardmask openings.

Figure 3H:
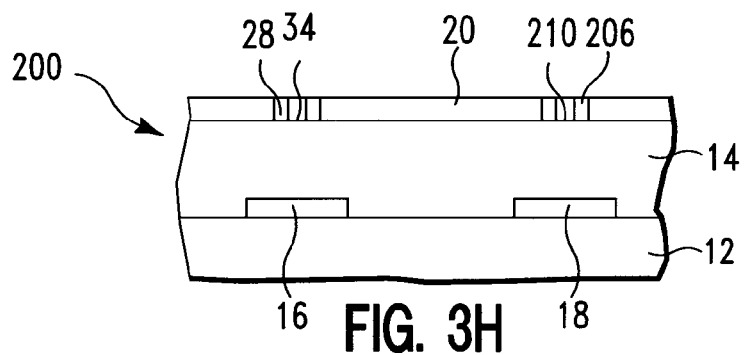

Then, self-assembling polymers 28, 206 are etched, for example with acetic acid solution, to form openings 34, 210 as shown in FIG. 3H. While openings 34, 210 are of different shapes, they are both sublithographic.

Figure 3I:
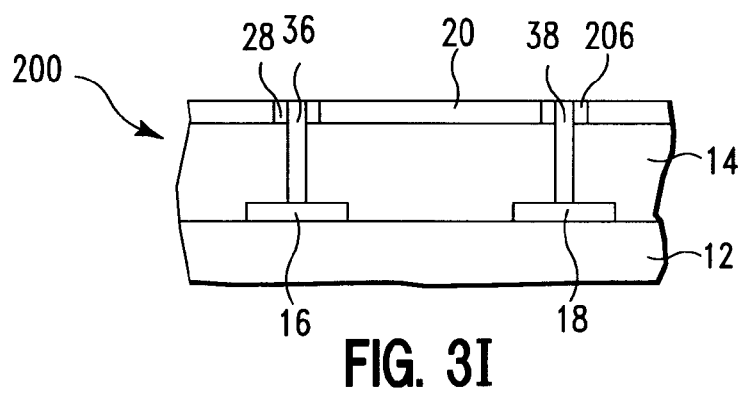
Figure 3J:
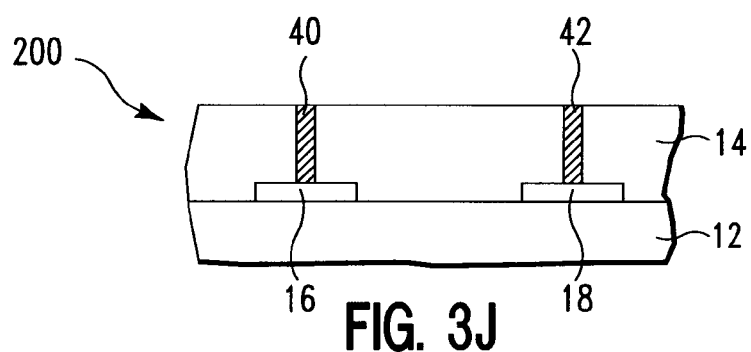

ILD 14 is etched through openings 34, 210 to form openings 36, 38 in the ILD 14 as shown in FIG. 3I. Lastly openings 36, 38 are filled with conductive material to form wiring features 40, 42 in contact with wiring features 16, 18, respectively, as shown in FIG. 3J. Again, wiring features 40, 42 may be a via, wiring line or a combination thereof.

It should be understood that either the first 28 or second 206 self-assembling polymer can be selectively removed from an opening in the hard mask 20 so that at least one of the wiring features (via and/or a wiring line) can be formed by conventional lithographic processing as was described with reference to FIGS. 2A to 2D.

Certain of the self-assembling polymers may not be robust enough to withstand the etching of ILD 14 as shown in, for example FIG. 1F. Accordingly, the present inventors have modified the previous embodiments to further include a second hard mask. With the second hard mask, it is only necessary for the self-assembling polymers to withstand a relatively shorter etch time to etch the second hard mask, which is then used to etch the ILD 14.

Figure 5A:
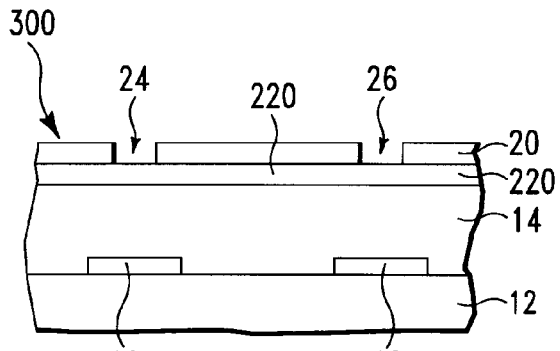
FIGS. 5A to 5F are figures illustrating the process for forming a fourth embodiment according to the present invention.

Referring now to FIGS. 5A through 5F, there is disclosed a fourth embodiment of the present invention. The fourth embodiment of the present invention is similar to the first embodiment of the present invention with one important difference being the use of a second hard mask. As shown in FIG. 5A, semiconductor structure 300 includes hard mask 20 which has been patterned as described previously. Underneath hard mask 20 is a second hard mask 220, also of conventional material. Preferably, hard mask 220 is of a different material than hard mask 20 so that the etching of hard mask 20 does not affect hard mask 220.

Figure 5B:
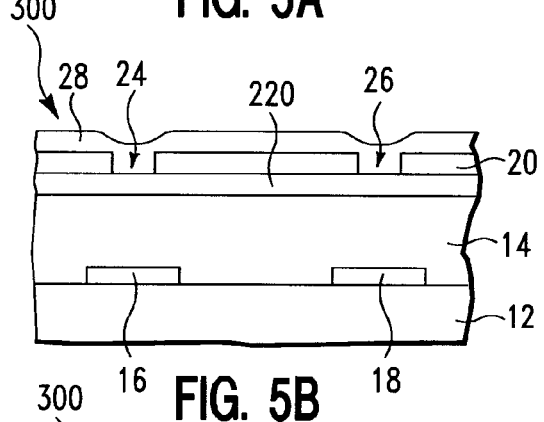
Figure 5C:
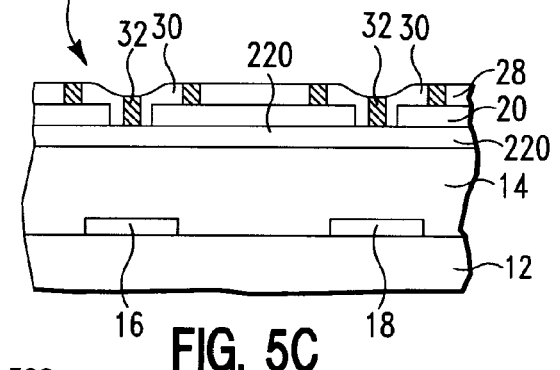

Self-assembling polymer 28 is applied over hard mask 20 and into openings 24, 26 followed by annealing at 200 to 300° C. for 30 to 90 minutes as shown in FIGS. 5B and 5C, respectively. After annealing, self assembling polymer 28 has formed first and second components 30, 32 as described above.

Figure 5D:
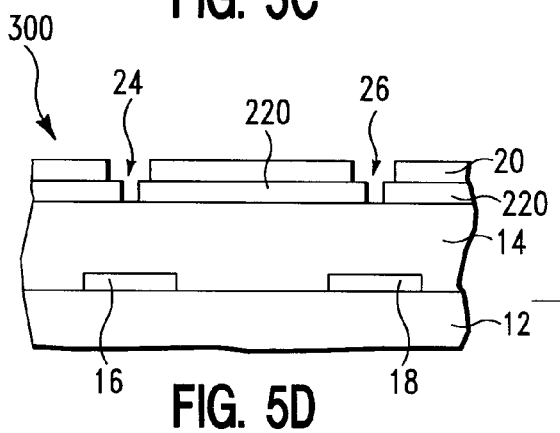

Referring now to FIG. 5D, the self-assembling polymer 28 is dry etched (for example with $CHF_3/CF_4$. The self-assembling polymer 28 has sufficient etch selectivity such that second component 32 etches out first and then hard mask 220. Eventually, all of the self-assembling polymer 28 is consumed by the dry etching but not before the hard mask 220 is etched to form narrowed openings 24, 26 in hard mask 220 as shown in FIG. 5D.

Figure 5E:
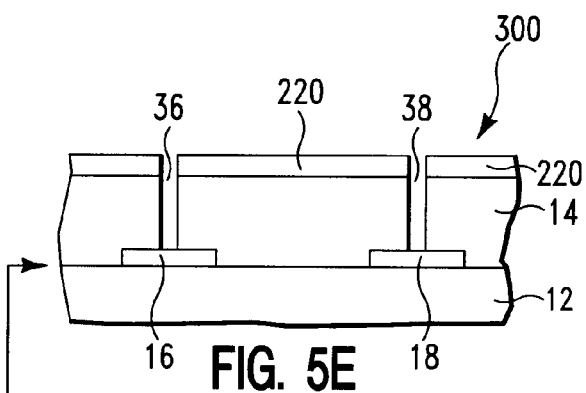

Thereafter, the ILD 14 is etched to form openings 36, 38 as shown in FIG. 5E.

Figure 5F:
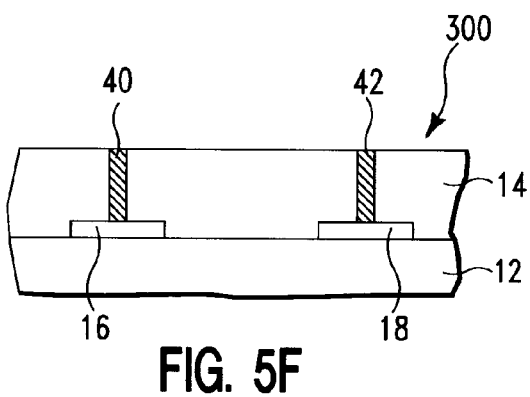

Hard mask 220 is removed by conventional means and then openings 36, 38 are filled with metallization to result in wiring features 40, 42 as shown in FIG. 5F.

Figure 6A:
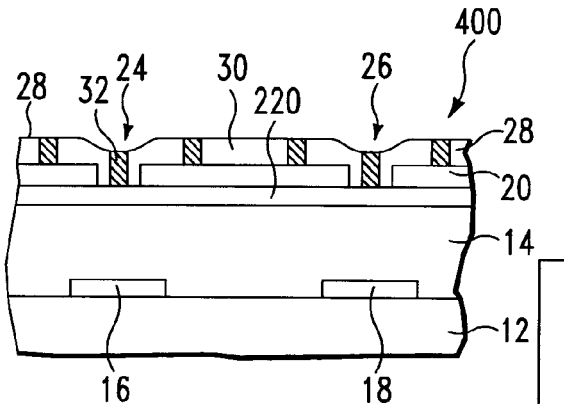
FIGS. 6A to 6F are figures illustrating the process for forming a fifth embodiment according to the present invention.
Figure 6D:
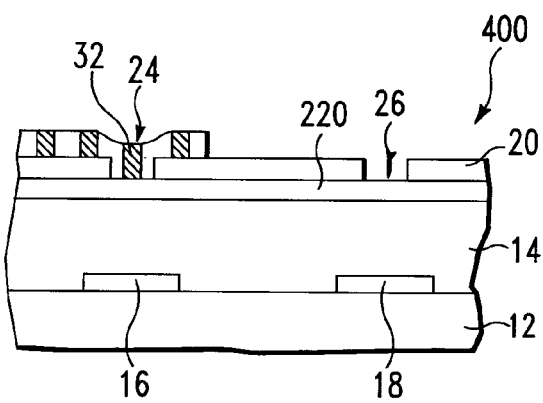

Fifth and sixth embodiments of the present invention are shown in FIGS. 6A through 6F and FIGS. 7A through 7H, respectively. As can be appreciated, the fifth and sixth embodiments of the present invention are similar to the second embodiment of the present invention with one important difference being the second hard mask. Referring first to the sixth embodiment of the present invention, and particularly referring to FIG. 6A, semiconductor structure 400 is shown having the structure essentially shown and described with respect to FIG. 5C. Self-assembling polymer 28 has already been annealed.

Figure 6B:
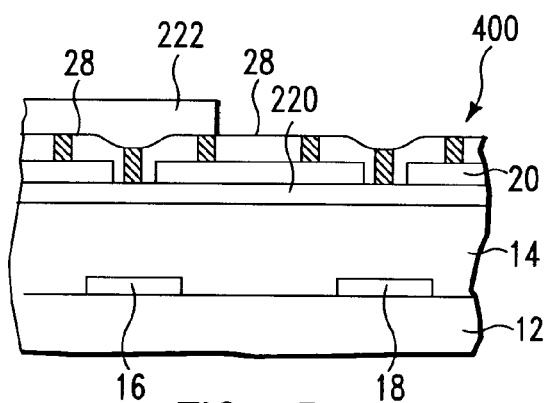

Referring now to FIG. 6B, an alcohol solvent based photoresist 222 is applied, exposed and developed. It is noted that photoresist 222 only partially covers the self-assembling polymer 28.

Figure 6E:
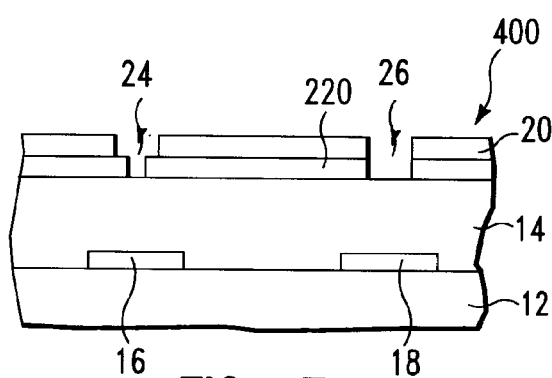
Figure 6C:
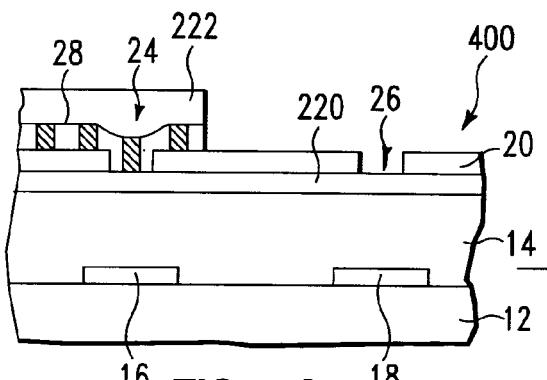

Thereafter, as shown in FIG. 6C, semiconductor structure 400 is dry etched, for example with $CHF_3CF_4$, which removes self-assembling polymer 28 which has not been protected by photoresist 222. Photoresist 222 is also thinned somewhat. The photoresist is then removed with a suitable solvent, such as IPA, to result in the structure shown in FIG. 6D.

Semiconductor structure 400 is again dry etched, for example with $CHF_3/CF_4$. As can be seen in FIG. 6E, due to the etch selectivity of the self-assembling polymer 28, second component 32 is etched first, allowing narrowed opening 24 to form in hard mask 220. It is noted that opening 26 in hard mask 20 has not been narrowed down and is essentially the same size as the opening in hard mask 20. Thus, opening 26 is a lithographically sized feature opening while opening 24 is sublithographic.

Figure 6F:
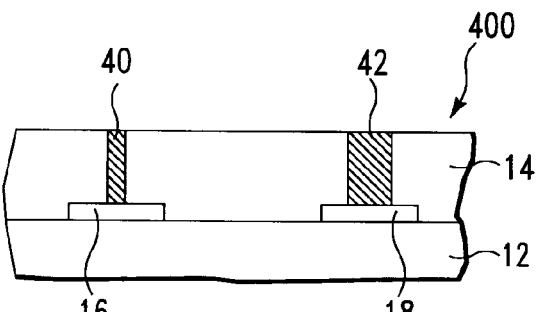

Lastly, after etching of the ILD 14 and removal of hard masks 20, 220, openings are formed in the ILD 14 which are filled with conductive material to result in wiring feature 40, 42 as shown in FIG. 6F.

Figure 7A:
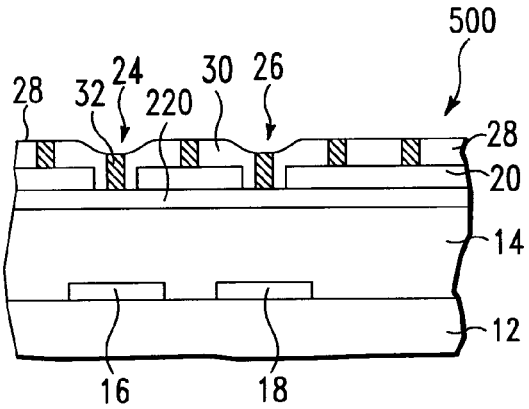
FIGS. 7A to 7H are figures illustrating the process for forming a sixth embodiment according to the present invention.
Figure 7D:
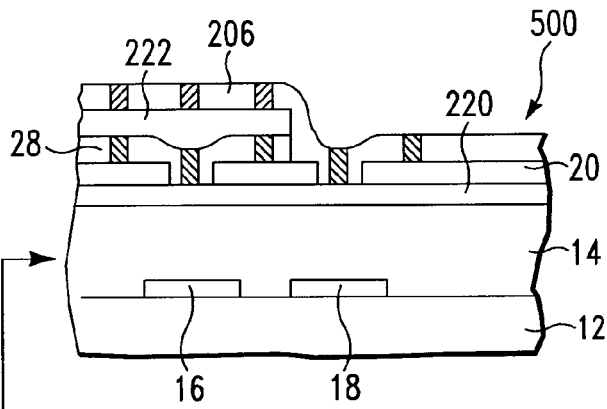
Figure 7B:
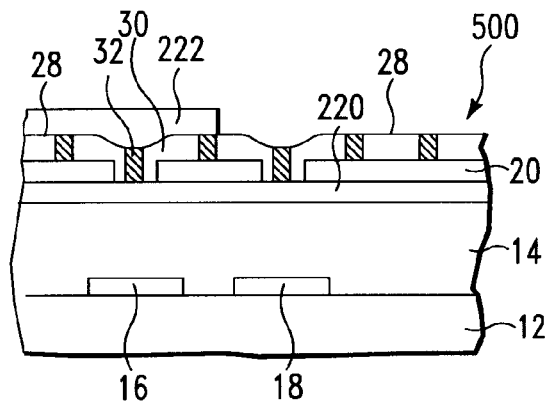
Figure 7E:
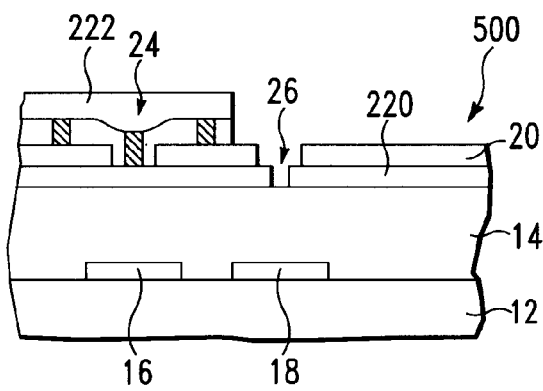
Figure 7C:
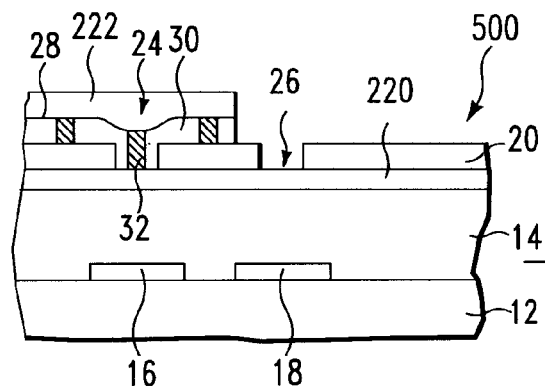

Referring now to FIGS. 7A through 7H, a sixth embodiment of the present invention will be described. FIGS. 7A through 7C are essentially the same as FIGS. 6A through 6C as described above. Now, as shown in FIG. 7D, a second self-assembling polymer 206 is applied to the semiconductor structure 500 and annealed. Self-assembling polymer 206 may be a totally different self-assembling polymer than self-assembling polymer 28 or may just have different ratios of the components of the polymers The semiconductor structure 500 is dry etched, for example with $CHF_3/CF_4$, to remove self-assembling polymer 206 from the right side of the semiconductor structure 500 and form narrowed opening 26 in hard mask 220. Self-assembling polymer 206 has also been removed from photoresist 222 as shown in FIG. 7E.

Figure 7F:
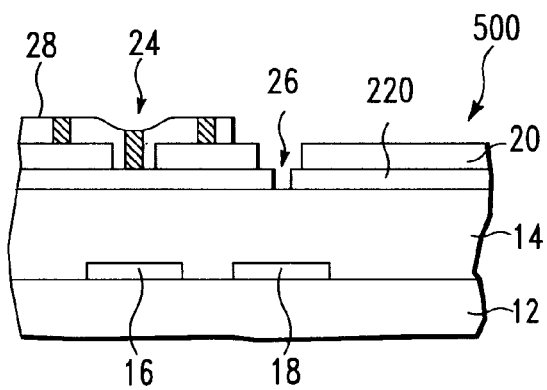

Thereafter, as shown in FIG. 7F, photoresist 222 is removed, for example, with IPA.

Figure 7G:
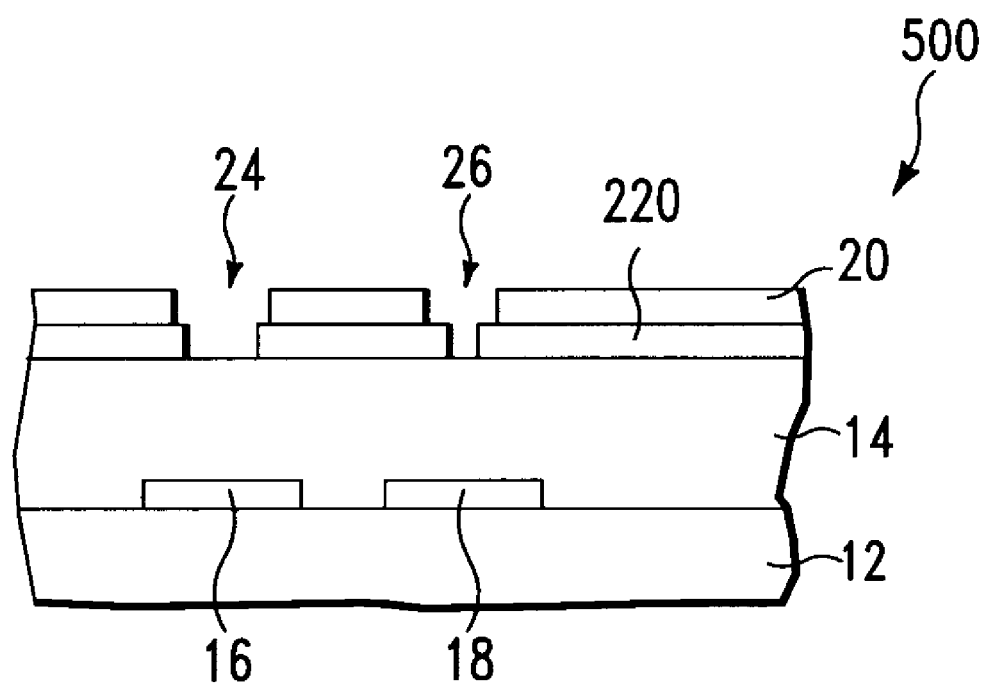

Semiconductor structure 500 is again dry etched, for example with CHF$_3$/CF$_4$, to remove self-assembling polymer 206 from the left side of the semiconductor structure and form narrowed opening 24 in hard mask 220 as shown in FIG. 7G.

Figure 7H:
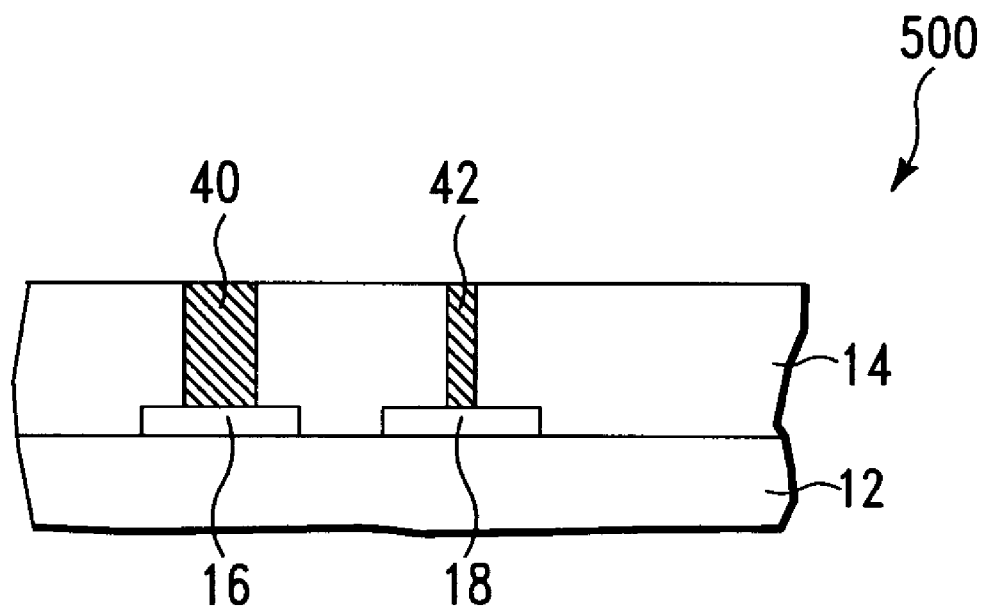

Then, ILD 14 is etched as described above to form openings in ILD 14, followed by removal of hard masks 20, 220 and then filling with conductive material to result in wiring features 40, 42 as shown FIG. 7H.

The seventh embodiment of the present invention is illustrated with respect to FIGS. 8A through 8F. The seventh embodiment of the present invention is similar to the third embodiment of the present invention with one important difference being the second hard mask. The processing of the seventh embodiment of the present invention as shown in FIGS. 8A through 8D is essentially identical to the processing previously described with respect to FIGS. 7A through 7D.

Figure 8A:
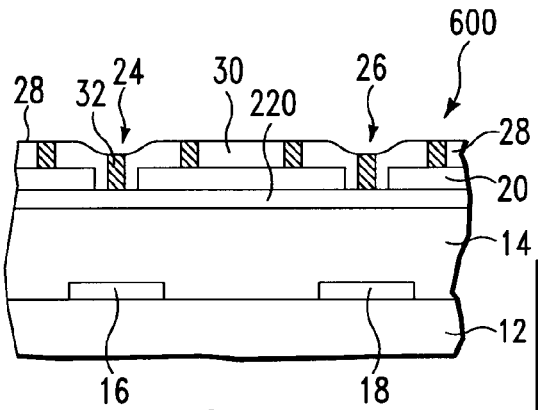
FIGS. 8A to 8F are figures illustrating the process for forming a seventh embodiment according to the present invention.
Figure 8D:
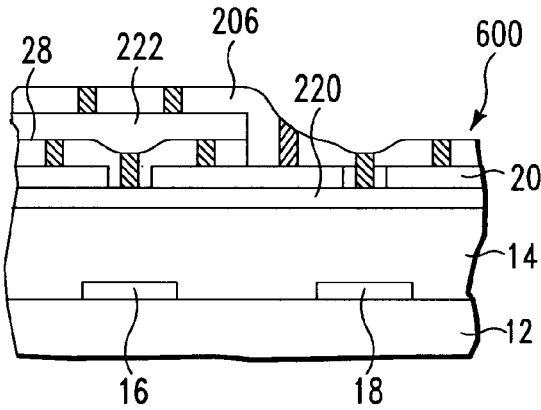
Figure 8B:
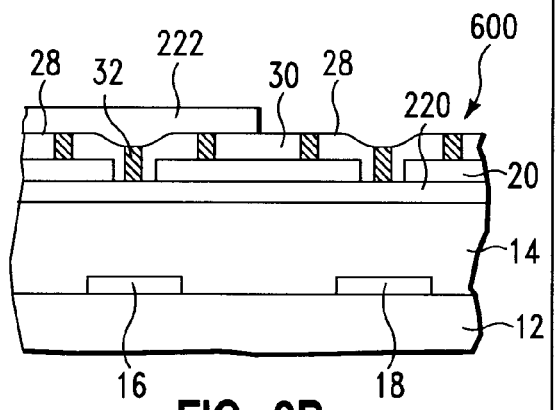
Figure 8E:
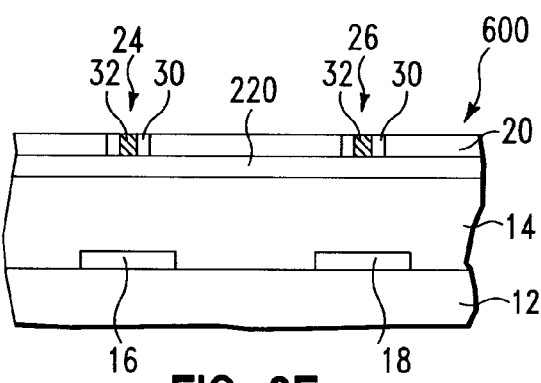
Figure 8C:
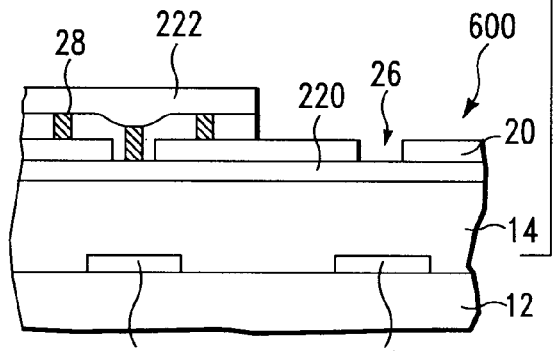

Referring now to FIG. 8E semiconductor structure 600 has been planarized using chemical-mechanical polishing down to hard mask 20 to remove the overlying self-assembling polymer 206, photoresist 222 and self-assembling polymer 28. However, self-assembling polymer 28 remains in opening 24 while self-assembling polymer 206 remains in opening 26.

Figure 8F:
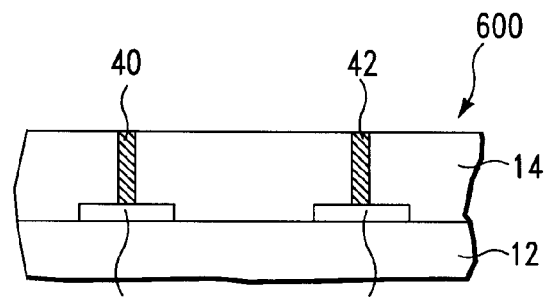

After dry etching, with CHF$_3$/CF$_4$ for example, narrowed openings are formed in hard mask 220 followed by etching of ILD 14 as described previously. The openings in ILD 14 are formed with conductive material to result in wiring features 40, 42 as shown in FIG. 8F. An advantage of this embodiment of the present invention is that because two different self-assembling polymers can be used, or the same self-assembling polymers but with different ratios of the components of the polymer, the dimensions of the second component 32 that is preferentially etched are different for each of the openings 24, 26, thereby resulting in wiring features 40, 42, both of which are sublithographic.

An eighth preferred embodiment according to the present invention is an intermediate semiconductor structure comprising the semiconductor device structure shown in, for example, FIGS. 1F, 2C and 3I) in which there is a plurality of interconnect wirings wherein at least one of the interconnect wirings 36 has a dimension that is defined by a self-assembled block copolymer 28.

A ninth preferred embodiment according to the present invention is an intermediate semiconductor structure comprising the semiconductor device structure shown in, for example, FIG. 2C in which there is a plurality of interconnect wirings wherein at least one 36 of the interconnect wirings has a dimension that is defined by a self-assembled block copolymer, and at least one 38 of the interconnect wirings has a dimension that is defined by a lithographically patterned mask.

The previous embodiments according to the present invention have shown a limited number of vias and lines which have been formed according to the teachings of the present invention. It should be understood that there will be a plurality of such lines and vias formed according to the teachings of the present invention in a typical semiconductor structure.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming patterned features in a semiconductor device structure, comprising the steps of:
    (a) forming a patterned mask layer over a surface of the semiconductor device structure, wherein said patterned mask layer comprises a plurality of mask openings;
    (b) applying a layer of a block copolymer over the patterned mask layer and in the plurality of mask openings, said block copolymer comprising first and second polymeric block components that are immiscible with each other;
    (c) annealing the block copolymer layer to form a polymer block pattern inside said plurality of mask openings, and wherein the polymer block pattern comprises the second polymeric block component embedded in a polymeric matrix that comprises the first polymeric block component;
    (d) selectively removing the block copolymer layer from at least one of the plurality of mask openings, while keeping the block copolymer layer inside at least another of the plurality of mask openings;
    (e) selectively removing the second polymeric block component from the first polymeric block component to form an opening in the polymeric matrix inside said at least another of the plurality of mask openings where the block copolymer layer is kept; and
    (f) patterning the semiconductor device structure using the opening of the copolymer and the plurality of mask openings.

2. The method of claim 1, wherein the block copolymer, when applied and annealed, self-assembles into an ordered array of multiple structural units in the polymeric matrix.

3. The method of claim 1 wherein the plurality of mask openings have a predetermined dimension such that there is only one second polymeric block component formed in the first polymeric block component inside each of said plurality of mask openings.

4. The method of claim 3 wherein the predetermined dimension is between 60 and 100 nm.

5. The method of claim 1, wherein the first and second polymeric block components are present in the block copolymer at a weight ratio of from about 80:20 to about 60:40.

6. The method of claim 1, wherein the block copolymer comprises polystyrene and poly(methyl-methacrylate) (PS-b-PMMA) having a PS:PMMA weight ratio ranging from about 80:20 to about 60:40.

7. The method of claim 1 wherein the block copolymer is selected from the group consisting of polystyrene-block-polymethylmethacrylate (PS-b-PMMA), polystyrene-block-polyisoprene (PS-b-PD, polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

8. The method of claim 1 wherein the semiconductor structure further comprises a second mask layer beneath the first mask layer and further comprising the step after step (e) of patterning the second mask layer to form an opening using the opening in the polymeric matrix wherein the opening in the second mask layer is smaller than the opening in the first mask layer.

9. A method of forming patterned features in a semiconductor device structure, comprising the steps of:
   (a) forming a patterned first mask layer over a second mask layer over a surface of the semiconductor device structure, wherein said patterned first mask layer comprises first and second mask openings;
   (b) applying a first layer of a block copolymer over the patterned first mask layer and in at least one first mask opening, said block copolymer comprising first and second polymeric block components that are immiscible with each other;
   (c) annealing the first block copolymer layer to form a first polymer block pattern inside said at least one first mask opening, and wherein said first polymer block pattern comprises the second polymeric block component embedded in a polymeric matrix that comprises the first polymeric block component;
   (d) applying a second layer of a block copolymer over the patterned mask layer and in at least one second mask opening, wherein said block copolymer comprises at least first and second polymeric block components;
   (e) annealing the second block copolymer layer to form a second polymer block pattern inside said at least one second mask opening, and wherein each polymer block pattern comprises the second polymeric block component and embedded in a polymeric matrix that comprises the first polymeric block component;
   (f) selectively removing the second polymeric block component from the first polymeric block component in said at least one first and second mask openings so as to form an opening in the polymeric matrix inside said at least one first mask opening and an opening in the polymeric matrix inside said at least one second mask opening;
   (g) patterning the second mask layer to form openings in the second mask layer using the openings in the polymeric matrix in the first and second mask openings wherein the openings in the second mask layer are smaller than the openings in the first mask layer; and
   (h) patterning the semiconductor device structure using the openings in the second mask layer.

10. The method of claim 9, wherein the first and second layers of block copolymer, when applied and annealed, self-assemble into an ordered array of multiple structural units in the respective polymeric matrices.

11. The method of claim 9 wherein the at least one first and second mask openings have a predetermined dimension such that there is only one second polymeric block component formed in the first polymeric block component in each of said at least one first and second mask openings.

12. The method of claim 11 wherein the predetermined dimension is between 60 and 100 nm.

13. The method of claim 9 wherein the first and second layers of block copolymers comprise different materials.

14. The method of claim 9 wherein the first and second layers of block copolymers comprise the same material but with different mixing ratio.

15. The method of claim 9 wherein there are a plurality of first mask openings and the first block copolymer layer is in the plurality of first mask openings and further comprising the step after step (c) of selectively removing the first block copolymer from at least one of the plurality of first mask openings.

16. The method of claim 9 wherein there are a plurality of second mask openings and the second block copolymer layer is in the plurality of second mask openings and further comprising the step after step (e) of selectively removing the second block copolymer from at least one of the plurality of second mask openings.

17. The method of claim 9, wherein the first block copolymer pattern is a line pattern and the second block copolymer pattern is a via pattern.

18. The method of claim 9, wherein the first block copolymer pattern is a via pattern and the second block copolymer pattern is a line pattern.

19. The method of claim 9, wherein the first block copolymer comprises PS-b-PMMA having a PS:PMMA weight ratio of 70:30 and the second block copolymer comprises PS:PMMA weight ratio of 50:50.

20. The method of claim 9 wherein the block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-P OS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylene (PEO-b-PEE), polybutadiene-block-polyvinylpyridine (PBD-b-PVP), and polyisoprene-block-polymethylmethacrylate (PI-b-PMMA).

21. A method of forming patterned features in a semiconductor device structure, comprising the steps of:
   (a) forming a patterned mask layer over a surface of the semiconductor device structure, wherein said patterned mask layer comprises at least one mask opening;
   (b) applying a layer of a block copolymer over the patterned mask layer and in the at least one mask opening, said block copolymer comprising first and second polymeric block components that are immiscible with each other;
   (c) annealing the block copolymer layer to form a polymer block pattern inside said at least one mask opening, and wherein the polymer block pattern comprises the second polymeric block component embedded in a polymeric matrix that comprises the first polymeric block component;
   (d) selectively removing the second polymeric block component from the first polymeric block component to form an opening in the polymeric matrix inside said at least one mask opening; and
   (e) patterning the semiconductor device structure using the opening of the copolymer and the at least one mask opening, wherein the at least one mask opening has a predetermined dimension such that there is only one second polymeric block component formed in the first polymeric block component.

22. The method of claim 21 wherein the predetermined dimension is between 60 and 100 nm.

23. A method of forming patterned features in a semiconductor device structure, comprising the steps of:
   (a) forming a patterned mask layer over a surface of the semiconductor device structure, wherein said patterned mask layer comprises first and second mask openings;
   (b) applying a first layer of a block copolymer over the patterned mask layer and in at least one first mask opening, said block copolymer comprising first and second polymeric block components that are immiscible with each other;

(c) annealing the first block copolymer layer to form a first polymer block pattern inside said at least one first mask opening, and wherein said first polymer block pattern comprises the second polymeric block component embedded in a polymeric matrix that comprises the first polymeric block component;

(d) applying a second layer of a block copolymer over the patterned mask layer and in at least one second mask opening, wherein said block copolymer comprises at least first and second polymeric block components;

(e) annealing the second block copolymer layer to form a second polymer block pattern inside said at least one second mask opening, and wherein each polymer block pattern comprises the second polymeric block component and embedded in a polymeric matrix that comprises the first polymeric block component;

(f) selectively removing the second polymeric block component from the first polymeric block component in said at least one first and second mask openings so as to form an opening in the polymeric matrix inside said at least one first mask opening and an opening in the polymeric matrix inside said at least one second mask opening; and (g) patterning the semiconductor device structure using the openings of the copolymer and the at least one first and second mask openings, wherein the at least one first and second mask openings have a predetermined dimension such that there is only one second polymeric block component formed in the first polymeric block component in each of said at least one first and second mask openings.

24. The method of claim 23 wherein the predetermined dimension is between 60 and 100 nm.

* * * * *